(12) United States Patent
Suzuki et al.

(10) Patent No.: US 8,592,811 B2
(45) Date of Patent: Nov. 26, 2013

(54) ACTIVE MATRIX SUBSTRATE AND DISPLAY PANEL

(75) Inventors: Masahiko Suzuki, Osaka (JP); Yoshimasa Chikama, Osaka (JP); Yuuji Mizuno, Osaka (JP); Hinae Mizuno, legal representative, Yamato (JP); Yoshifumi Ohta, Osaka (JP); Tokuo Yoshida, Osaka (JP); Okifumi Nakagawa, Osaka (JP); Yoshiyuki Harumoto, Osaka (JP); Yoshinobu Miyamoto, Osaka (JP); Tetsuya Yamashita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/697,106

(22) PCT Filed: Feb. 14, 2011

(86) PCT No.: PCT/JP2011/000808
§ 371 (c)(1), (2), (4) Date: Nov. 28, 2012

(87) PCT Pub. No.: WO2011/142064
PCT Pub. Date: Nov. 17, 2011

(65) Prior Publication Data
US 2013/0207114 A1 Aug. 15, 2013

(30) Foreign Application Priority Data
May 11, 2010 (JP) ................................. 2010-109411

(51) Int. Cl.
| H01L 29/10 | (2006.01) |
|---|---|
| H01L 29/12 | (2006.01) |
| H01L 27/12 | (2006.01) |
| H01L 27/088 | (2006.01) |
| H01L 29/06 | (2006.01) |
| H01L 23/48 | (2006.01) |
| H01L 23/52 | (2006.01) |
| H01L 29/40 | (2006.01) |
| G02F 1/136 | (2006.01) |

(52) U.S. Cl.
USPC ............. 257/43; 257/350; 257/401; 257/622; 257/774; 257/E29.117; 349/43

(58) Field of Classification Search
None
See application file for complete search history.

(56) References Cited

U.S. PATENT DOCUMENTS 7,351,623 B2 * 4/2008 Ahn .............................. 438/158
7,408,597 B2 * 8/2008 Lee et al. ......................... 349/43
(Continued)

FOREIGN PATENT DOCUMENTS

| JP | 2003-051463 A | 2/2003 |
|---|---|---|
| JP | 2005-190992 A | 7/2005 |

(Continued)

OTHER PUBLICATIONS

Official Communication issued in International Patent Application No. PCT/JP2011/000808, mailed on Mar. 15, 2011.

*Primary Examiner* — Hoang-Quan Ho
(74) *Attorney, Agent, or Firm* — Keating & Bennett, LLP

(57) ABSTRACT

An active matrix substrate (20a) includes a plurality of pixel electrodes (18a) arranged in a matrix, and a plurality of TFTs (5) each connected to a corresponding one of the pixel electrodes (18a), and each including a gate electrode (11a) provided on an insulating substrate (10a), a gate insulating film (12a) covering the gate electrode (11a), a semiconductor layer (16a) provided on the gate insulating film (12a) and having a channel region (C) overlapping the gate electrode (11a), and a source electrode (15aa) and a drain electrode (15b) of copper or copper alloy provided on the gate insulating film (12a) and separated from each other by the channel region (C) of the semiconductor layer (16a). The semiconductor layer (16a) is formed of an oxide semiconductor and covers the source electrode (15aa) and the drain electrode (15b).

9 Claims, 13 Drawing Sheets

(56) References Cited

U.S. PATENT DOCUMENTS

| | | | |
|---|---|---|---|
| 7,851,835 B2 * | 12/2010 | Kang et al. | 257/290 |
| 2007/0120471 A1 | 5/2007 | Yamazaki et al. | |
| 2008/0316410 A1 | 12/2008 | Fujii et al. | |
| 2010/0102311 A1 | 4/2010 | Ito et al. | |
| 2012/0126227 A1 | 5/2012 | Maeda et al. | |

FOREIGN PATENT DOCUMENTS

| | | |
|---|---|---|
| JP | 2009-015316 A | 1/2009 |
| JP | 2010-056136 A | 3/2010 |
| JP | 2010-103360 A | 5/2010 |
| WO | 2011/013683 A1 | 2/2011 |

* cited by examiner (a)

(b)

(c)

(d)

(a)

(b)

(c)

(d)

(a)

(b)

(c)

(d)

(a)

(b)

(c)

(d)

ACTIVE MATRIX SUBSTRATE AND DISPLAY PANEL

TECHNICAL FIELD

The present invention relates active matrix substrates and display panels. More particularly, the present invention relates to an active matrix substrate employing copper interconnects and a display panel including the active matrix substrate.

BACKGROUND ART

An active matrix substrate included in a display panel, such as a liquid crystal display panel etc., includes interconnects for display, such as a plurality of gate lines extending in parallel to each other, a plurality of source lines extending in parallel to each other in a direction perpendicular to the gate lines, etc.

For the active matrix substrate, an interconnection structure has in recent years been proposed in which a copper interconnect, which has a lower electrical resistance than that of a conventional aluminum interconnect, is used as the display interconnect, similar to semiconductor devices.

Here, in a liquid crystal display panel including the active matrix substrate employing the copper interconnect, because the copper interconnect has a relatively low electrical resistance as described above, the interconnection structure employing the copper interconnect can contribute to an increase in size and resolution, double-speed drive display, a reduction in power consumption, etc. of the liquid crystal display panel. However, copper in the copper interconnect is likely to diffuse into an amorphous silicon film or a silicon oxide film during the manufacturing process or the operation in high-temperature and high-humidity atmosphere. Therefore, for example, the following problems arise: if copper diffuses into the back channel of a TFT, the threshold voltage (Vth) of the TFT may be changed; and if copper diffuses into a liquid crystal material, the liquid crystal material deteriorates.

For example, PATENT DOCUMENT 1 describes a display device in which, in an electrode layer used in a display element, the concentration of an ionic impurity contaminating a liquid crystal material, a light emitting material, etc. of the display element is reduced to 100 ppm or less.

CITATION LIST

Patent Document

PATENT DOCUMENT 1: Japanese Patent Publication No. 2009-15316

SUMMARY OF THE INVENTION

Technical Problem

Incidentally, in the interconnection structure employing the copper interconnect, a barrier layer is commonly provided at an interface of the copper interconnect in order to reduce or prevent the copper diffusion. However, in the active matrix substrate, if the barrier layer is formed on a surface of the display interconnect employing the copper interconnect, a step of forming a thin film for forming the barrier layer and a step of patterning the thin film are required, resulting in an increase in the number of manufacturing steps.

It is with respect to these and other considerations that the present invention has been made. It is an object of the present invention to reduce the copper diffusion while reducing the increase in the number of manufacturing steps.

Solution to the Problem

To achieve the object, in the present invention, a source electrode and a drain electrode of copper or copper alloy are covered by a semiconductor layer of an oxide semiconductor.

Specifically, an active matrix substrate according to the present invention includes a plurality of pixel electrodes arranged in a matrix, and a plurality of thin film transistors each connected to a corresponding one of the pixel electrodes, and each including a gate electrode provided on an insulating substrate, a gate insulating film covering the gate electrode, a semiconductor layer provided on the gate insulating film and having a channel region overlapping the gate electrode, and a source electrode and a drain electrode of copper or copper alloy provided on the gate insulating film and separated from each other by the channel region of the semiconductor layer. The semiconductor layer is formed of an oxide semiconductor and covers the source and drain electrodes.

With this configuration, the source and drain electrodes provided on the gate insulating film are formed of copper or copper alloy, and therefore, the copper is likely to diffuse. However, the source and drain electrodes are covered by the semiconductor layer of an oxide semiconductor, whereby the diffusion of the copper into the upper layers is reduced or prevented. Here, the semiconductor layer for reducing or preventing the diffusion of the copper into the upper layers is formed of an oxide semiconductor instead of conventionally used amorphous silicon, and is formed to cover the source and drain electrode, whereby the copper diffusion can be reduced or prevented while an increase in the number of manufacturing steps is reduced or prevented. The reduction or prevention of the copper diffusion leads to a reduction or prevention in the change of the threshold voltage (Vth) of the thin film transistor.

A barrier layer configured to reduce or prevent diffusion of the copper from the source and drain electrodes may be provided on sides closer to the gate insulating film of the source and drain electrodes.

With this configuration, the barrier layer is provided on the sides closer to the gate insulating film of the source and drain electrodes, whereby the diffusion of the copper into the lower layers is reduced or prevented.

The gate insulating film may be formed of a silicon oxide film.

With this configuration, the gate insulating film is formed of a silicon oxide film. Therefore, for example, the occurrence of lack of oxygen in the semiconductor layer of an oxide semiconductor due to elimination of hydrogen, which is likely to occur in the silicon nitride film, is reduced or prevented. Also, because the gate insulating film is formed of a silicon oxide film, the copper is likely to diffuse from the source and drain electrodes into the lower layers. However, if a barrier layer is provided on the sides closer to gate insulating film of the source and drain electrodes, the diffusion of the copper into the lower layers is reduced or prevented.

An interlayer insulating film of a silicon oxide film may be provided to cover each of the thin film transistors.

With this configuration, the interlayer insulating film of a silicon oxide film is provided to cover each of the thin film transistors. Therefore, for example, the occurrence of lack of oxygen in the semiconductor layer of an oxide semiconductor due to elimination of hydrogen, which is likely to occur in the silicon nitride film, is reduced or prevented. Also, because the interlayer insulating film of a silicon oxide film is provided to cover the thin film transistors, the copper is likely to diffuse from the source and drain electrodes into the upper layers. However, the semiconductor layer of an oxide semiconductor is provided to cover the source and drain electrodes, whereby the diffusion of the copper into the upper layers is effectively reduced or prevented.

Each of the pixel electrodes may be provided on the interlayer insulating film, and may be connected to the drain electrode of a corresponding one of the thin film transistors via a contact hole formed in the interlayer insulating film and a contact hole formed in the semiconductor layer. The contact hole formed in the interlayer insulating film may be larger than the contact hole formed in the semiconductor layer as viewed from above, and a step-like portion may be provided between an inner wall of the contact hole formed in the interlayer insulating film and an inner wall of the contact hole formed in the semiconductor layer.

With this configuration, the pixel electrode and the drain electrode are connected together via the contact holes formed in the interlayer insulating film and the semiconductor layer. The contact hole of the interlayer insulating film is larger than the contact hole of the semiconductor layer as viewed from above. The step-like portion is provided between the inner wall of the contact hole of the interlayer insulating film and the inner wall of the contact hole of the semiconductor layer. Therefore, for example, compared to when no step-like portion is provided between the inner wall of the contact hole of the interlayer insulating film and the inner wall of the contact hole of the semiconductor layer (i.e., the inner walls form a continuous surface), the overall slope of the inner walls of the contact holes is caused to be gentler by an amount corresponding to the step-like portion. As a result, the transparent conductive film for forming the pixel electrode is more easily formed on the entire surfaces of the inner walls of the contact holes, and therefore, the pixel electrode and the thin film transistor (the drain electrode thereof) are more reliably connected together.

The active matrix substrate may include an underlying interconnect formed in the same layer in which the gate electrode is provided and formed of the same material as that of the gate electrode, and an interconnect terminal layer formed in the same layer in which the pixel electrodes are provided, formed of the same material as that of the pixel electrodes, and connected to the underlying interconnect. The underlying interconnect and the interconnect terminal layer may be connected together via a contact hole formed in the interlayer insulating film and a contact hole formed in the gate insulating film. Another semiconductor layer of the same material as that of the semiconductor layer and having an annular shape may be provided between the gate insulating film and the interlayer insulating film, surrounding the contact hole formed in the gate insulating film and being exposed through the contact hole formed in the interlayer insulating film.

With this configuration, the underlying interconnect and the interconnect terminal layer are connected together via the contact holes of the interlayer insulating film and the gate insulating film. Another semiconductor layer having an annular shape is provided between the gate insulating film and the interlayer insulating film, surrounding the contact hole of the gate insulating film and being exposed through the contact hole of the interlayer insulating film. Therefore, the other semiconductor layer of an oxide semiconductor serves as an etch stopper when a contact hole is formed in the interlayer insulating film. Therefore, the contact hole of the interlayer insulating film is larger than the contact hole of the gate insulating film as viewed from above, and a step-like portion is provided between an inner wall of the contact hole of the interlayer insulating film and an inner wall of the contact hole of the gate insulating film. Therefore, for example, compared to when no step-like portion is provided between the inner wall of the contact hole of the interlayer insulating film and the inner wall of the contact hole of the semiconductor layer (i.e., the inner walls form a continuous surface), the overall slope of the inner walls of the contact holes is caused to be gentler by an amount corresponding to the step-like portion. As a result, the transparent conductive film for forming the interconnect terminal layer is more easily formed on the entire surfaces of the inner walls of the contact holes, and therefore, the interconnect terminal layer and the underlying interconnect are more reliably connected together.

The underlying interconnect may be a gate line connected to the gate electrode.

With this configuration, the underlying interconnect is a gate line connected to the gate electrode. Therefore, the interconnect terminal layer and the gate line are more reliably connected together.

The active matrix substrate may include a source line formed in the same layer in which the source and drain electrodes are provided, formed of the same material as that of the source and drain electrodes, covered by the semiconductor layer, and connected to the source electrode, and an interconnect connection layer formed of the same layer in which the pixel electrodes are formed, formed of the same material as that of the pixel electrodes, and connecting the underlying interconnect and the source line together. The source line and the interconnect connection layer may be connected together via a contact hole formed in the interlayer insulating film and a contact hole formed in the semiconductor layer. In a connection portion of the source line and the interconnect connection layer, the contact hole formed in the interlayer insulating film may be larger than the contact hole formed in the semiconductor layer as viewed from above, and a step-like portion may be provided between an inner wall of the contact hole formed in the interlayer insulating film and an inner wall of the contact hole formed in the semiconductor layer. The underlying interconnect and the interconnect connection layer may be connected together via the contact hole formed in the interlayer insulating film and the contact hole formed in the gate insulating film. In a connection portion of the underlying interconnect and the interconnect connection layer, the semiconductor layer may be provided between the gate insulating film and the interlayer insulating film, surrounding the contact hole formed in the gate insulating film and being exposed through the contact hole formed in the interlayer insulating film.

With this configuration, the source line and the interconnect connection layer are connected together via the contact holes of the interlayer insulating film and the semiconductor layer. The contact hole of the interlayer insulating film is larger than the contact hole of the semiconductor layer as viewed from above. The step-like portion is provided between the inner wall of the contact hole of the interlayer insulating film and the inner wall of the contact hole of the semiconductor layer. Therefore, for example, compared to when no step-like portion is provided between the inner wall of the contact hole of the interlayer insulating film and the inner wall of the contact hole of the semiconductor layer (i.e., the inner walls form a continuous surface), the overall slope of the inner walls of the contact holes is caused to be gentler by an amount corresponding to the step-like portion. The underlying interconnect and the interconnect connection layer are connected together via the contact holes of the interlayer insulating film and the gate insulating film. In the connection portion of the underlying interconnect and the interconnect connection layer, the semiconductor layer is provided between the gate insulating film and the interlayer insulating film, surrounding the contact hole of the gate insulating film and being exposed through the contact hole of the interlayer insulating film. Therefore, the semiconductor layer of an oxide semiconductor serves as an etch stopper when a contact hole is formed in the interlayer insulating film. Therefore, the contact hole of the interlayer insulating film is larger than the contact hole of the gate insulating film as viewed from above, and the step-like portion is provided between the inner wall of the contact hole of the interlayer insulating film and the inner wall of the contact hole of the gate insulating film. Therefore, for example, compared to when no step-like portion is provided between the inner wall of the contact hole of the interlayer insulating film and the inner wall of the contact hole of the gate insulating film (i.e., the inner walls form a continuous surface), the overall slope of the inner walls of the contact holes is caused to be gentler by an amount corresponding to the step-like portion. As a result, the transparent conductive film for forming the interconnect connection layer is more easily formed on the entire surfaces of the inner walls of the contact holes, and therefore, the source line and the source lead are more reliably connected together.

A display panel according to the present invention includes an active matrix substrate and a counter substrate facing each other, and a display medium layer provided between the active matrix substrate and the counter substrate. The active matrix substrate includes a plurality of pixel electrodes arranged in a matrix, and a plurality of thin film transistors each connected to a corresponding one of the pixel electrodes, and each including a gate electrode provided on an insulating substrate, a gate insulating film covering the gate electrode, a semiconductor layer provided on the gate insulating film and having a channel region overlapping the gate electrode, and a source electrode and a drain electrode of copper or copper alloy provided on the gate insulating film and separated from each other by the channel region of the semiconductor layer. The semiconductor layer is formed of an oxide semiconductor and covers the source and drain electrodes.

With this configuration, in the active matrix substrate, the source and drain electrodes provided on the gate insulating film are formed of copper or copper alloy, and therefore, the copper is likely to diffuse. However, the source and drain electrodes are covered by the semiconductor layer of an oxide semiconductor, whereby the diffusion of the copper into the upper layers is reduced or prevented. Here, the semiconductor layer for reducing or preventing the diffusion of the copper into the upper layers is formed of an oxide semiconductor instead of conventionally used amorphous silicon, and is formed to cover the source and drain electrode, whereby the copper diffusion can be reduced or prevented while an increase in the number of manufacturing steps is reduced or prevented in the display panel including the active matrix substrate. The reduction or prevention of the copper diffusion leads to a reduction or prevention in the change of the threshold voltage (Vth) of the thin film transistor and a reduction or prevention in the deterioration of the display medium material included in the display medium layer.

Advantages of the Invention

According to the present invention, the source and drain electrodes of copper or copper alloy are covered by the semiconductor layer of an oxide semiconductor. Therefore, the copper diffusion can be reduced or prevented while an increase in the number of manufacturing steps is reduced or prevented.

DESCRIPTION OF EMBODIMENTS

Embodiments of the present invention will be described in detail hereinafter with reference to the accompanying drawings. Note that the present invention is not intended to be limited to the embodiments described below.

<<First Embodiment of the Invention>>

Figure 1:
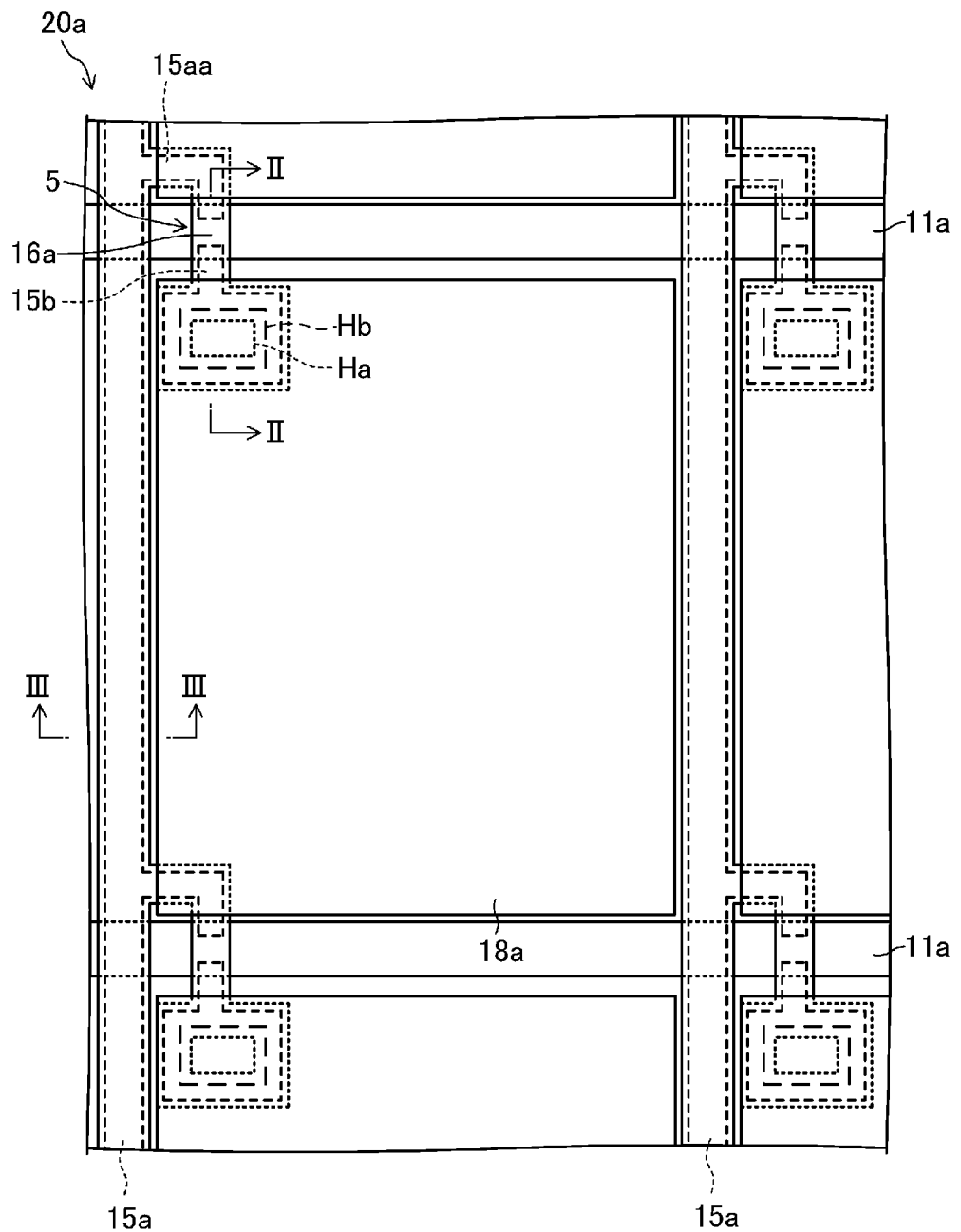
FIG. 1 is a plan view of an active matrix substrate according to a first embodiment.
Figure 2:
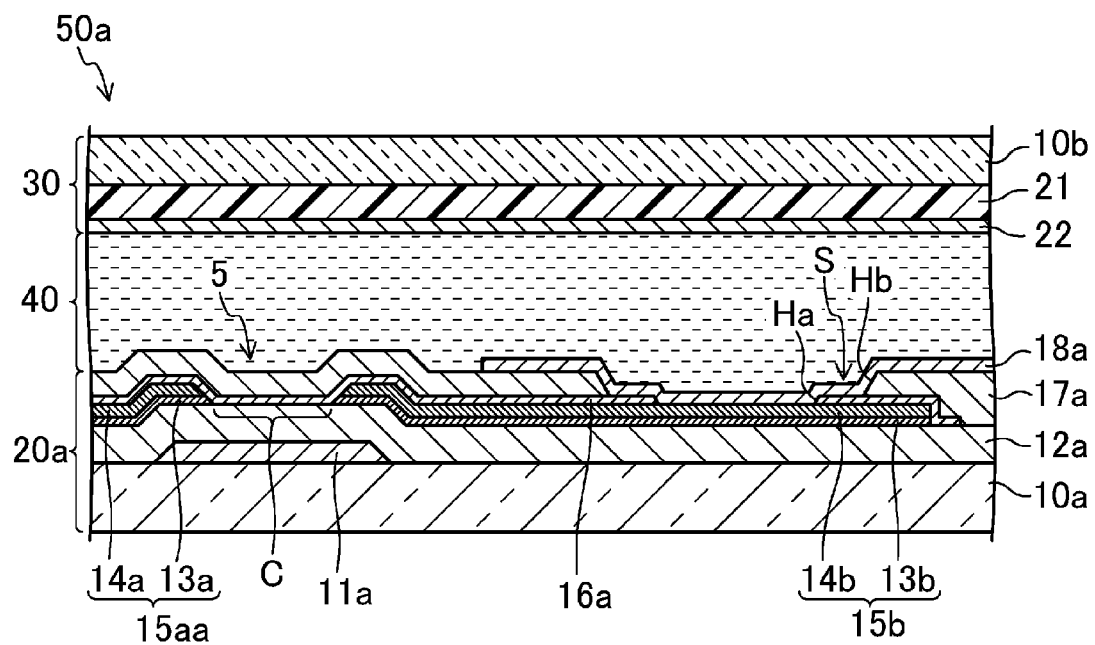
FIG. 2 is a cross-sectional view of the active matrix substrate and a liquid crystal display panel including the active matrix substrate, taken along line II-II of FIG. 1.
Figure 3:
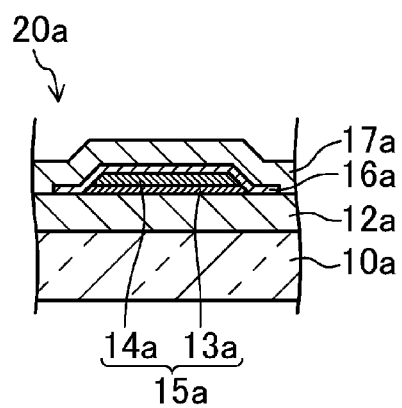
FIG. 3 is a cross-sectional view of the active matrix substrate, taken along line III-III of FIG. 1.
Figure 4:
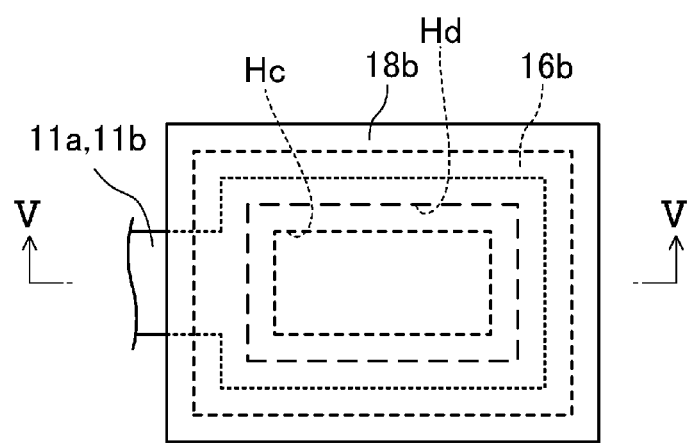
FIG. 4 is a plan view of an interconnect terminal portion of the active matrix substrate of the first embodiment.
Figure 5:
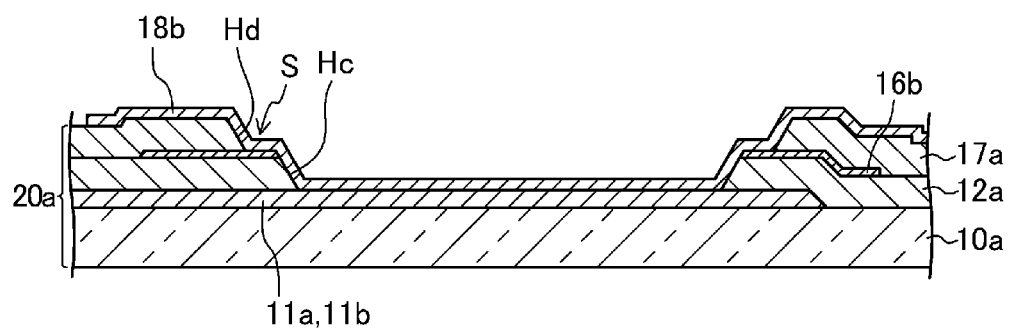
FIG. 5 is a cross-sectional view of the interconnect terminal portion of the active matrix substrate, taken along line V-V of FIG. 4.
Figure 6:
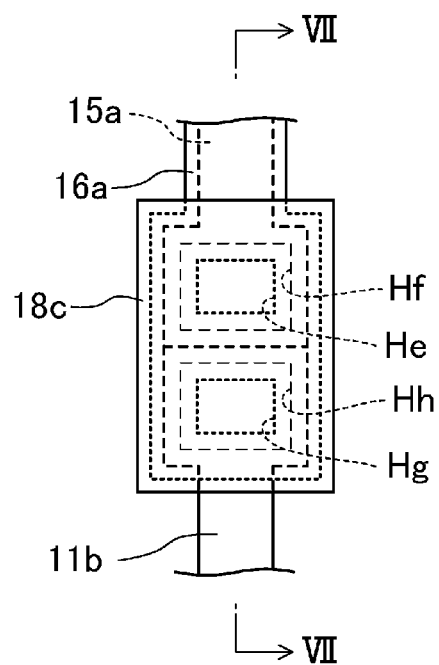
FIG. 6 is a plan view of an interconnect connection portion of the active matrix substrate of the first embodiment.
Figure 7:
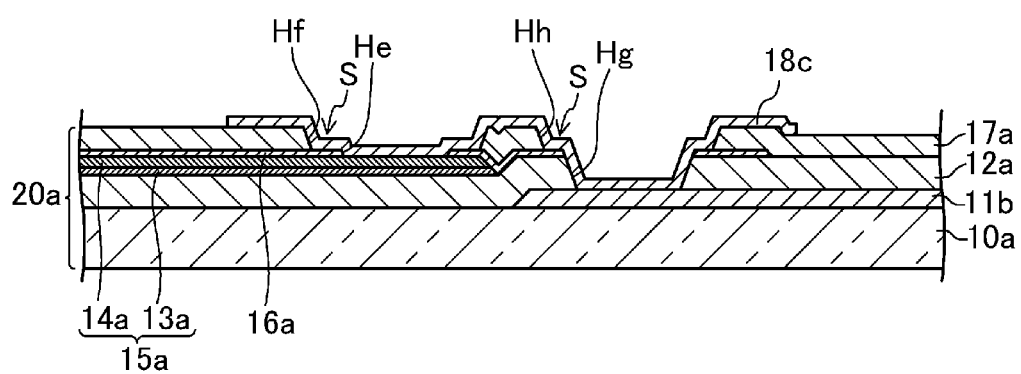
FIG. 7 is a cross-sectional view of the interconnect connection portion of the active matrix substrate, taken along line VII-VII of FIG. 6.

FIGS. 1-10 show a first embodiment of an active matrix substrate and a display panel according to the present invention. Specifically, FIG. 1 is a plan view of the active matrix substrate 20a of this embodiment. FIG. 2 is a cross-sectional view of the active matrix substrate 20a and the liquid crystal display panel 50a including the active matrix substrate 20a, taken along line II-II of FIG. 1. FIG. 3 is a cross-sectional view of the active matrix substrate 20a, taken along line III-III of FIG. 1. FIG. 4 is a plan view of an interconnect terminal portion of the active matrix substrate 20a. FIG. 5 is a cross-sectional view of the interconnect terminal portion, taken along line V-V of FIG. 4. FIG. 6 is a plan view of an interconnect connection portion of the active matrix substrate 20a. FIG. 7 is a cross-sectional view of the interconnect connection portion, taken along line VII-VII of FIG. 6.

As shown in FIG. 2, the liquid crystal display panel 50a includes the active matrix substrate 20a and a counter substrate 30 which face each other, a liquid crystal layer 40 which is provided as a display medium layer between the active matrix substrate 20a and the counter substrate 30, and a frame-like sealing material (not shown) with which the active matrix substrate 20a and the counter substrate 30 are bonded together and which encloses the liquid crystal layer 40 between the active matrix substrate 20a and the counter substrate 30.

As shown in FIGS. 1 and 2, the active matrix substrate 20a includes an insulating substrate 10a, a plurality of gate lines 11a (underlying interconnects) which are provided on the insulating substrate 10a, extending in parallel to each other, a plurality of source lines 15a which extend in parallel to each other in a direction perpendicular to the gate lines 11a, a plurality of TFTs 5 which are provided at respective corresponding intersection portions of the gate lines 11a and the source lines 15a (i.e., one TFT is provided for each pixel), an interlayer insulating film 17a which is provided to cover the TFTs 5, a plurality of pixel electrodes 18a which are provided on the interlayer insulating film 17a and arranged in a matrix, and an alignment film (not shown) which is provided to cover the pixel electrodes 18a.

As shown in FIGS. 1 and 2, the TFT 5 includes a gate electrode (11a) which is provided on the insulating substrate 10a, a gate insulating film 12a which is provided to cover the gate electrode (11a), a semiconductor layer 16a which has a channel region C which is provided on the gate insulating film 12a, overlapping the gate electrode (11a), and a source electrode 15aa and a drain electrode 15b which are provided on the gate insulating film 12a, overlapping the gate electrode (11a) and separated from each other by the channel region C of the semiconductor layer 16a.

As shown in FIG. 1, the gate electrode (11a) is a portion of the corresponding gate line 11a.

As shown in FIG. 1, the source electrode 15aa is an L-shaped, laterally protruding portion of the corresponding source line 15a. As shown in FIG. 2, the source line 15a and the source electrode 15aa each include a barrier layer 13a which is provided on the gate insulating film 12a, and an interconnect layer 14a which is provided on the barrier layer 13a and is formed of copper.

As shown in FIGS. 1 and 2, the drain electrode 15b is connected to the pixel electrode 18a via a contact hole Ha formed in the semiconductor layer 16a and a contact hole Hb formed in the interlayer insulating film 17a. As shown in FIG. 2, the drain electrode 15b includes a barrier layer 13b which is provided on the gate insulating film 12a, and an interconnect layer 14b which is provided on the barrier layer 13b and is formed of copper. Here, as shown in FIGS. 1 and 2, the contact hole Hb formed in the interlayer insulating film 17a is larger than the contact hole Ha formed in the semiconductor layer 16a as viewed from above. A step-like portion S is provided between an inner wall of the contact hole Hb formed in the interlayer insulating film 17a and an inner wall of the contact hole Ha formed in the semiconductor layer 16a.

The semiconductor layer 16a is formed of, for example, an oxide semiconductor, such as In—Ga—Zn—O etc. As shown in FIG. 2, the semiconductor layer 16a has the channel region C between the source electrode 15aa and the drain electrode 15b. As shown in FIGS. 1-3, the semiconductor layer 16a is provided to cover the source line 15a, the source electrode 15aa, and the drain electrode 15b.

The gate line 11a is extended out of a display area for displaying images. As shown in FIGS. 4 and 5, an end portion of the gate line 11a is connected to a corresponding one of interconnect terminal layers 18b arranged in a direction in which the source line 15a is extended, via a contact hole Hc formed in the gate insulating film 12a and a contact hole Hd formed in the interlayer insulating film 17a. Here, in a connection portion of the gate line 11a and the interconnect terminal layer 18b, an annular semiconductor layer 16b is provided between the gate insulating film 12a and the interlayer insulating film 17a, surrounding the contact hole Hc formed in the gate insulating film 12a and being exposed through the contact hole Hd formed in the interlayer insulating film 17a. Specifically, as shown in FIGS. 4 and 5, a step-like portion S is provided between an inner wall of the contact hole Hd formed in the interlayer insulating film 17a and an inner wall of the contact hole Hc formed in the gate insulating film 12a.

The source line 15a is extended out of the display area. As shown in FIGS. 6 and 7, an end portion of the source line 15a is connected via an interconnect connection layer 18c to a source lead 11b which is provided as another underlying interconnect. The source lead 11b is connected to a corresponding one of the interconnect terminal layers 18b which are arranged along a direction in which the gate line 11a is extended, as with the gate line 11a (see FIGS. 4 and 5). Here, as shown in FIGS. 6 and 7, the source line 15a is connected to the interconnect connection layer 18c via a contact hole He formed in the semiconductor layer 16a and a contact hole Hf formed in the interlayer insulating film 17a. As shown in FIGS. 6 and 7, the contact hole Hf formed in the interlayer insulating film 17a is larger than the contact hole He formed in the semiconductor layer 16a as viewed from above. A step-like portion S is provided between an inner wall of the contact hole Hf formed in the interlayer insulating film 17a and an inner wall of the contact hole He formed in the semiconductor layer 16a. As shown in FIGS. 6 and 7, the source lead 11b is connected to the interconnect connection layer 18c via a contact hole Hg formed in the gate insulating film 12a and a contact hole Hh formed in the interlayer insulating film 17a. As shown in FIGS. 6 and 7, in the connection portion of the source lead 11b and the interconnect connection layer 18c, the semiconductor layer 16a is provided between the gate insulating film 12a and the interlayer insulating film 17a, surrounding the contact hole Hg formed in the gate insulating film 12a and being exposed through the contact hole Hh formed in the interlayer insulating film 17a. Specifically, as shown in FIGS. 6 and 7, a step-like portion S is provided between an inner wall of the contact hole Hh formed the interlayer insulating film 17a and an inner wall of the contact hole Hg of the gate insulating film 12a.

As shown in FIG. 2, the counter substrate 30 includes an insulating substrate 10b, a black matrix with a grid pattern provided on the insulating substrate 10b, a color filter 21 including a plurality of color layers (e.g., a red layer, a green layer, and a blue layer, etc.) which is provided between each grid bar of the black matrix, a common electrode 22 covering the color filter 21, and an alignment film (not shown) covering the common electrode 22.

The liquid crystal layer 40 is formed of, for example, a nematic liquid crystal material having electro-optic properties.

In the liquid crystal display panel 50a thus configured, a predetermined voltage is applied to the liquid crystal layer 40 provided between the pixel electrodes 18a on the active matrix substrate 20a and the common electrode 22 on the counter substrate 30 on a pixel-by-pixel basis to change the alignment of the liquid crystal layer 40 to adjust light transmission through the panel on a pixel-by-pixel basis, whereby an image is displayed.

Figure 8:
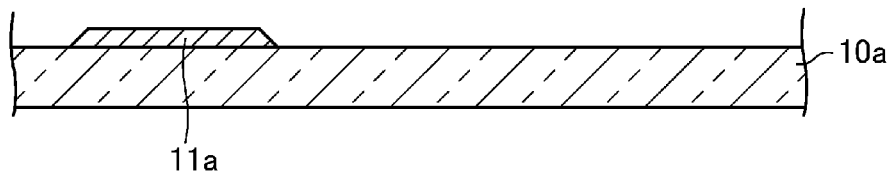
FIG. 8 is a diagram for describing a method for manufacturing the active matrix substrate of the first embodiment, showing cross-sectional views of a pixel portion.
Figure 8:
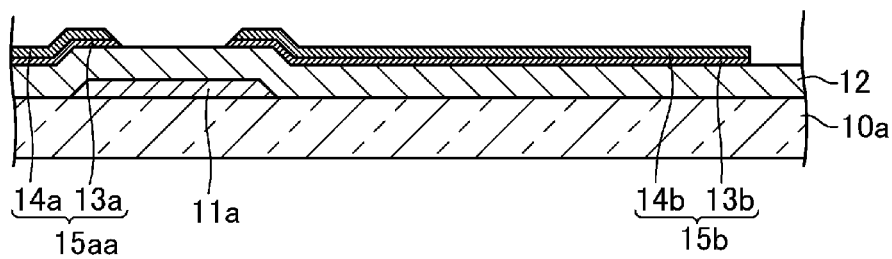
Figure 8:
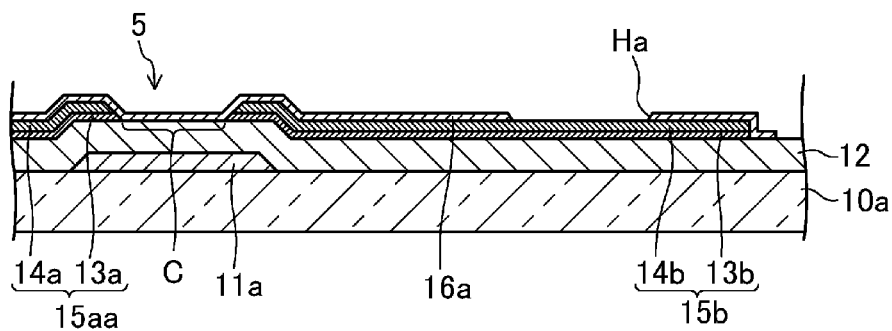
Figure 8:
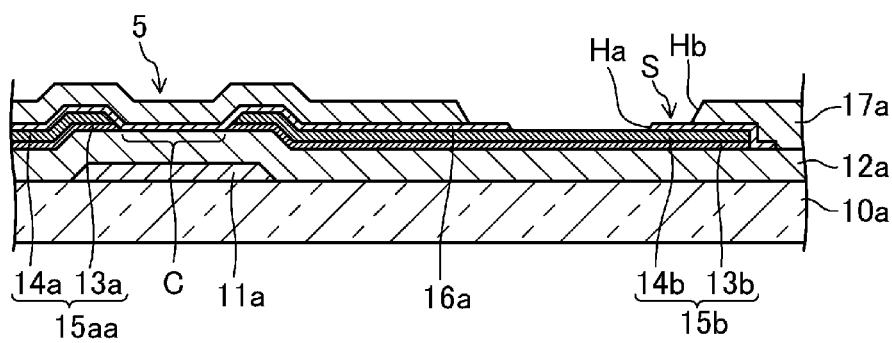
Figure 9:
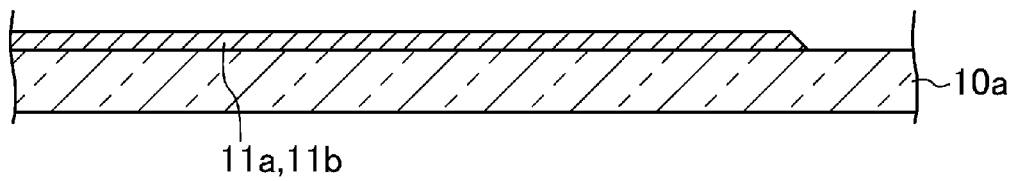
FIG. 9 is a diagram for describing the method for manufacturing the active matrix substrate of the first embodiment, showing cross-sectional views of an interconnect terminal portion.
Figure 9:
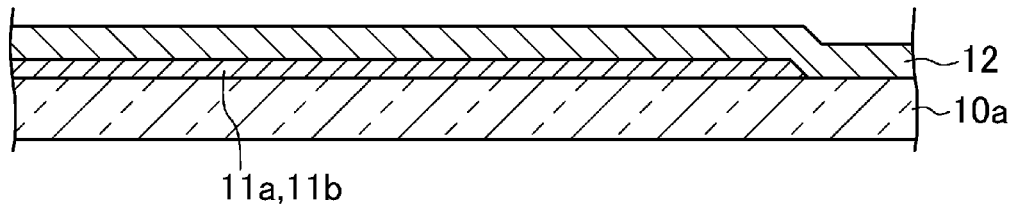
Figure 9:
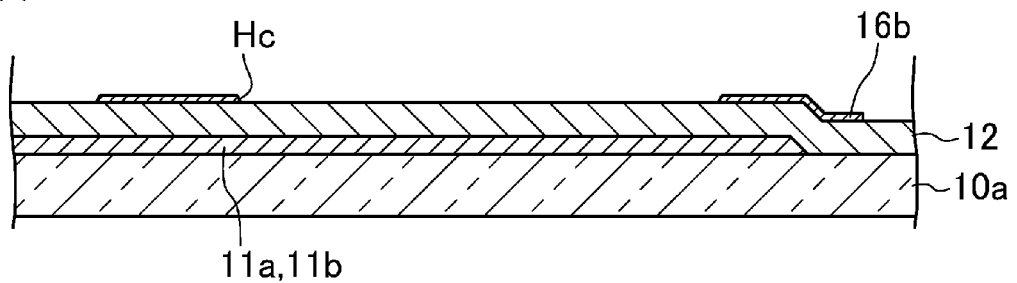
Figure 9:
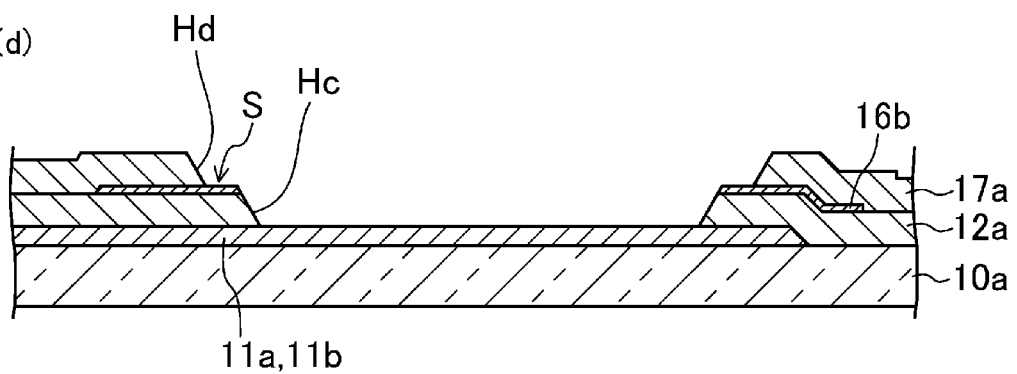
Figure 10:
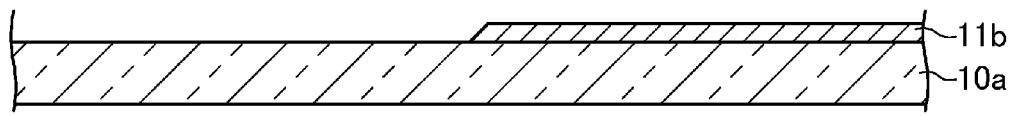
FIG. 10 is a diagram for describing the method for manufacturing the active matrix substrate of the first embodiment, showing cross-sectional views of an interconnect connection portion.
Figure 10:
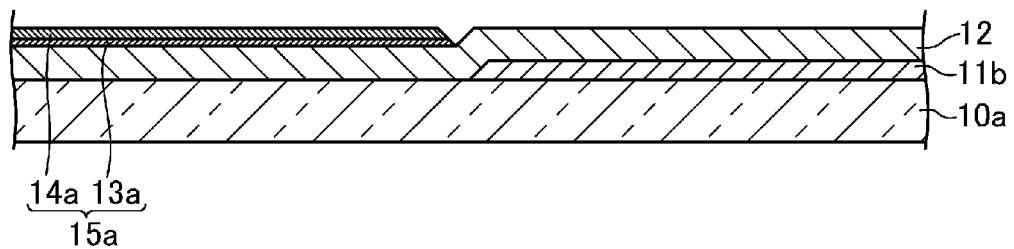
Figure 10:
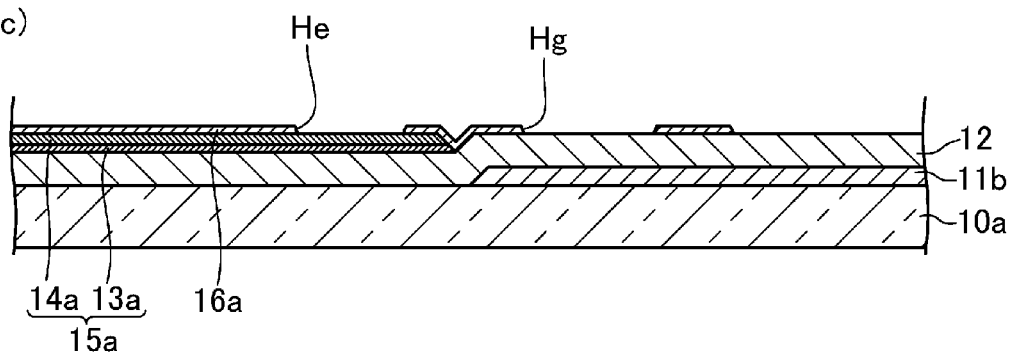
Figure 10:
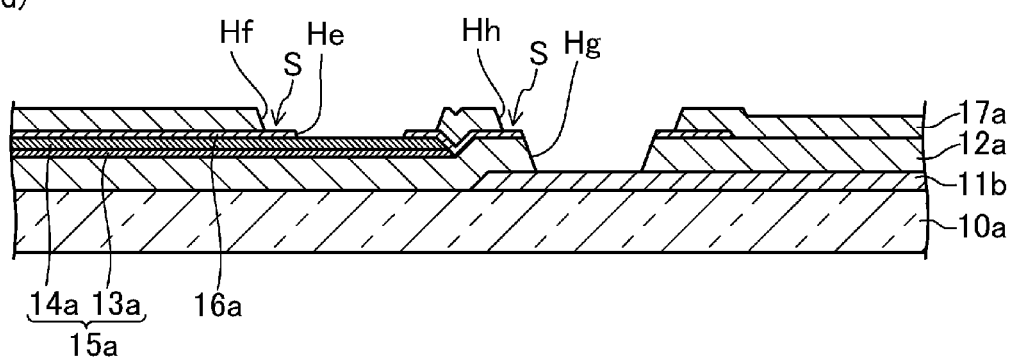

Next, a method for manufacturing the liquid crystal display panel 50a of this embodiment will be described with reference to FIGS. 8-10. Here, FIGS. 8, 9, and 10 are diagrams for describing the method for manufacturing the active matrix substrate 20a, showing cross-sections of a pixel portion, an interconnect terminal portion, and an interconnect connection portion, respectively. Note that the manufacturing method of this embodiment includes an active matrix substrate fabrication process, a counter substrate fabrication process, and a liquid crystal injection process.

<Active Matrix Substrate Fabrication Process>

Initially, for example, a titanium film, an aluminum film, and a titanium film, etc. are successively formed on the entire insulating substrate 10a (e.g., a glass substrate etc.) by sputtering to form a multilayer metal film (e.g., a Ti/Al/Ti film etc.) (thickness: about 100-500 nm). Thereafter, photolithography, wet or dry etching, and resist removal and cleaning are performed on the multilayer metal film. As a result, as shown in FIGS. 8(a), 9(a), and 10(a), the gate line 11a and the source lead 11b are formed.

Next, on the entire substrate on which the gate line 11a and the source lead 11b have been formed, for example, an inorganic insulating film 12 (e.g., a silicon oxide film (thickness: about 200-500 nm) etc.) (see FIGS. 8(b), 9(b), and 10(b)) is formed by chemical vapor deposition (CVD), and a barrier film (e.g., a titanium film (thickness: about 10-100 nm) etc.) and a copper film (thickness: about 100-300 nm) are successively formed by sputtering. Thereafter, photolithography, wet or dry etching, and resist removal and cleaning are performed on the multilayer film including the barrier film and the copper film. As a result, as shown in FIGS. 8(b) and 10(b), the source line 15a, the source electrode 15aa, and the drain electrode 15b are formed.

Thereafter, on the entire substrate on which the source line 15a, the source electrode 15aa, and the drain electrode 15b have been formed, for example, an oxide semiconductor film of In—Ga—Zn—O (e.g., $InGaZnO_4$ etc.) (thickness: about 20-200 nm) is formed by sputtering. Thereafter, photolithography, wet etching, and resist removal and cleaning are performed on the oxide semiconductor film. As a result, as shown in FIGS. 8(c), 9(c), and 10(c), the semiconductor layer 16a having the contact holes Ha, He, and Hg and the semiconductor layer 16b having the contact hole Hc are formed.

Next, on the entire surface on which the semiconductor layers 16a and 16b have been formed, for example, an inorganic insulating film (e.g., a silicon oxide film (thickness: about 100-300 nm) etc.) is formed by CVD. Thereafter, photolithography, wet or dry etching, and resist removal and cleaning are performed on the inorganic insulating film and the previously formed inorganic insulating film 12. As a result, as shown in FIGS. 8(d), 9(d), and 10(d), the gate insulating film 12a having the contact holes Hc and Hg and the interlayer insulating film 17a having the contact holes Hb, Hd, Hf, and Hh are formed. Here, when the gate insulating film 12a is formed by etching the inorganic insulating film 12, the semiconductor layers 16a and 16b serve as an etch stopper.

Finally, on the entire substrate on which the gate insulating film 12a and the interlayer insulating film 17a have been formed, for example, a transparent conductive film (e.g., an indium tin oxide (ITO) film (thickness: about 50-200 nm) etc.) is formed by sputtering. Thereafter, photolithography, wet etching, and resist removal and cleaning are performed on the transparent conductive film. As a result, as shown in FIGS. 2, 5, and 7, the pixel electrode 18a, the interconnect terminal layer 18b, and the interconnect connection layer 18c are formed.

Thus, the active matrix substrate 20a can be fabricated.

<Counter Substrate Fabrication Process>

Initially, on the entire insulating substrate 10b (e.g., a glass substrate etc.), for example, a black-colored photosensitive resin is applied by spin coating or slit coating, and thereafter, the applied film is exposed to light and developed, whereby a black matrix having a thickness of about 1.0 μm is formed.

Next, on the entire substrate on which the black matrix has been formed, a red-, green-, or blue-colored photosensitive resin is applied by spin coating or slit coating, and thereafter, the applied film is exposed to light and developed, whereby a color layer with a selected color (e.g., a red color layer) having a thickness of about 2.0 μm is formed. Moreover, by repeating a similar process for the two other colors, color layers with the two other colors (e.g., a green color layer and a blue color layer) each having a thickness of about 2.0 μm are formed. As a result, a color filter layer is formed.

Finally, on the substrate on which the color filter 21 has been formed, a transparent conductive film (e.g., an ITO film (thickness: about 50-200 nm) etc.) is formed by sputtering to form the common electrode 22.

Thus, the counter substrate 30 can be fabricated.

<Liquid Crystal Injection Process>

Initially, a resin film of polyimide is applied by a printing method on surfaces of the active matrix substrate 20a fabricated by the active matrix substrate fabrication process and the counter substrate 30 fabricated by the counter substrate fabrication process. Thereafter, burning and rubbing treatments are performed on the applied film. As a result, alignment films are formed.

Next, for example, on the surface of the counter substrate 30 on which the alignment film has been formed, a frame-like sealing material of an ultraviolet (UV) and thermal curing resin etc. is printed, and thereafter, a liquid crystal material is dropped into a region inside the sealing material.

Moreover, the counter substrate 30 on which the liquid crystal material has been dropped, and the active matrix substrate 20a on which the alignment film has been formed, are joined with each other under reduced pressure. Thereafter, the counter substrate 30 and the active matrix substrate 20a thus joined with each other are exposed to the atmosphere so that pressure is applied on the front and rear surfaces of the two-substrate structure.

Thereafter, the sealing material interposed between the active matrix substrate 20a and the counter substrate 30 joined with each other is irradiated with UV light and then heated, whereby the sealing material is cured to enclose the liquid crystal layer 40 between the active matrix substrate 20a and the counter substrate 30.

Finally, an unnecessary portion is removed from the two-substrate structure enclosing the liquid crystal layer 40 by cutting (e.g., dicing etc.).

Thus, the liquid crystal display panel 50a of this embodiment can be manufactured.

As described above, according to the active matrix substrate 20a of this embodiment and the liquid crystal display panel 50a including the active matrix substrate 20a, the source electrode 15aa and the drain electrode 15b provided on the gate insulating film 12a are formed of copper, and therefore, the copper is likely to diffuse. However, the source electrode 15aa and the drain electrode 15b are covered by the semiconductor layer 16a of an oxide semiconductor, whereby the diffusion of the copper into the upper layers can be reduced or prevented. Here, the semiconductor layer 16a for reducing or preventing the diffusion of the copper into the upper layers is formed of an oxide semiconductor instead of conventionally used amorphous silicon, and is formed to cover the source electrode 15aa and the drain electrode 15b, whereby the copper diffusion can be reduced or prevented while an increase in the number of manufacturing steps is reduced or prevented. The reduction or prevention of the copper diffusion leads to a reduction or prevention in the change of the threshold voltage (Vth) of the TFT 5 and a reduction or prevention in the deterioration of the liquid crystal material included in the liquid crystal layer 40. Therefore, even when the copper interconnect is used, a display panel having high reliability can be obtained.

According to the active matrix substrate 20a of this embodiment and the liquid crystal display panel 50a including the active matrix substrate 20a, the barrier layers 13a and 13b are provided on sides closer to the gate insulating film 12a of the source electrode 15aa and the drain electrode 15b, whereby the diffusion of the copper into the lower layers can be reduced or prevented.

According to the active matrix substrate 20a of this embodiment and the liquid crystal display panel 50a including the active matrix substrate 20a, the gate insulating film 12a is formed of a silicon oxide film. Therefore, for example, the occurrence of lack of oxygen in the semiconductor layer 16a due to elimination of hydrogen, which is likely to occur in the silicon nitride film, can be reduced or prevented.

According to the active matrix substrate 20a of this embodiment and the liquid crystal display panel 50a including the active matrix substrate 20a, the interlayer insulating film 17a of a silicon oxide film is provided to cover each TFT 5. Therefore, for example, the occurrence of lack of oxygen in the semiconductor layer 16a due to elimination of hydrogen, which is likely to occur in the silicon nitride film, can be reduced or prevented.

According to the active matrix substrate 20a of this embodiment and the liquid crystal display panel 50a including the active matrix substrate 20a, the pixel electrode 18a and the drain electrode 15b are connected together via the contact holes Hb and Ha of the interlayer insulating film 17a and the semiconductor layer 16a. The contact hole Hb of the interlayer insulating film 17a is larger than the contact hole Ha of the semiconductor layer 16a as viewed from above. The step-like portion S is provided between the inner wall of the contact hole Hb of the interlayer insulating film 17a and the inner wall of the contact hole Ha of the semiconductor layer 16a. Therefore, for example, compared to when no step-like portion is provided between the inner wall of the contact hole of the interlayer insulating film and the inner wall of the contact hole of the semiconductor layer (i.e., the inner walls form a continuous surface), the overall slope of the inner wall of the contact hole including the contact holes Ha and Hb can be caused to be gentler by an amount corresponding to the step-like portion S. As a result, the transparent conductive film for forming the pixel electrode 18a is more easily formed on the entire surfaces of the inner walls of the contact holes Ha and Hb, and therefore, the pixel electrode 18a and the drain electrode 15b of the TFT 5 can be more reliably connected together.

According to the active matrix substrate 20a of this embodiment and the liquid crystal display panel 50a including the active matrix substrate 20a, the underlying interconnect (the gate line 11a or the source lead 11b) and the interconnect terminal layer 18b are connected together via the contact holes Hd and Hc formed in the interlayer insulating film 17a and the gate insulating film 12a. The annular semiconductor layer 16b is provided between the gate insulating film 12a and the interlayer insulating film 17a, surrounding the contact hole Hc of the gate insulating film 12a and being exposed through the contact hole Hd of the interlayer insulating film 17a. Therefore, the semiconductor layer 16b of an oxide semiconductor serves as an etch stopper when the contact hole Hd is formed in the interlayer insulating film 17a. Therefore, the contact hole Hd of the interlayer insulating film 17a is larger than the contact hole Hc of the gate insulating film 12a as viewed from above, and the step-like portion S is provided between the inner wall of the contact hole Hd of the interlayer insulating film 17a and the inner wall of the contact hole Hc of the gate insulating film 12a. Therefore, for example, compared to when no step-like portion is provided between the inner wall of the contact hole of the interlayer insulating film and the inner wall of the contact hole of the semiconductor layer (i.e., the inner walls form a continuous surface), the overall slope of the inner wall of the contact hole including the contact holes Hc and Hd can be caused to be gentler by an amount corresponding to the step-like portion S. As a result, the transparent conductive film for forming the interconnect terminal layer 18b is more easily formed on the entire surfaces of the inner walls of the contact holes Hc and Hd, and therefore, the interconnect terminal layer 18b and the underlying interconnect (the gate line 11a or the source lead 11b) can be more reliably connected together.

According to the active matrix substrate 20a of this embodiment and the liquid crystal display panel 50a including the active matrix substrate 20a, the source line 15a and the interconnect connection layer 18c are connected together via the contact holes Hf and He of the interlayer insulating film 17a and the semiconductor layer 16a. The contact hole Hf of the interlayer insulating film 17a is larger than the contact hole He of the semiconductor layer 16a as viewed from above. The step-like portion S is provided between the inner wall of the contact hole Hf of the interlayer insulating film 17a and the inner wall of the contact hole He of the semiconductor layer 16a. Therefore, for example, compared to when no step-like portion is provided between the inner wall of the contact hole of the interlayer insulating film and the inner wall of the contact hole of the semiconductor layer (i.e., the inner walls form a continuous surface), the overall slope of the inner wall of the contact hole including the contact holes He and Hf can be caused to be gentler by an amount corresponding to the step-like portion S. The source lead 11b and the interconnect connection layer 18c are connected together via the contact holes Hh and Hg of the interlayer insulating film 17a and the gate insulating film 12a. In the connection portion of the source lead 11b and the interconnect connection layer 18c, the semiconductor layer 16a is provided between the gate insulating film 12a and the interlayer insulating film 17a, surrounding the contact hole Hg of the gate insulating film 12a and being exposed through the contact hole Hh of the interlayer insulating film 17a. Therefore, the semiconductor layer 16a serves as an etch stopper when a contact hole is formed in the interlayer insulating film 17a. Therefore, the contact hole Hh of the interlayer insulating film 17a is larger than the contact hole Hg of the gate insulating film 12a as viewed from above, and the step-like portion S is provided between the inner wall of the contact hole Hh of the interlayer insulating film 17a and the inner wall of the contact hole Hg of the gate insulating film 12a. Therefore, for example, compared to when no step-like portion is provided between the inner wall of the contact hole of the interlayer insulating film and the inner wall of the contact hole of the gate insulating film (i.e., the inner walls form a continuous surface), the overall slope of the inner wall of the contact hole including the contact holes Hg and Hh can be caused to be gentler by an amount corresponding to the step-like portion S. As a result, the transparent conductive film for forming the interconnect connection layer 18c is more easily formed on the entire surfaces of the inner walls of the contact holes He, Hf, Hg, and Hh, and therefore, the source line 15a and the source lead 11b can be more reliably connected together.

According to the active matrix substrate 20a of this embodiment and the liquid crystal display panel 50a including the active matrix substrate 20a, the semiconductor layer 16a of an oxide semiconductor is provided as the channel, whereby the TFT 5 can have satisfactory characteristics, such as a high mobility, high reliability, a low off current, etc.

According to the active matrix substrate 20a of this embodiment and the liquid crystal display panel 50a including the active matrix substrate 20a, the interconnect layers 14a and 14b of copper are used, whereby the display panel can be more effectively allowed to have a larger screen, a higher resolution, double-speed drive display, and lower power consumption.

<<Second Embodiment of the Invention>>

Figure 11:
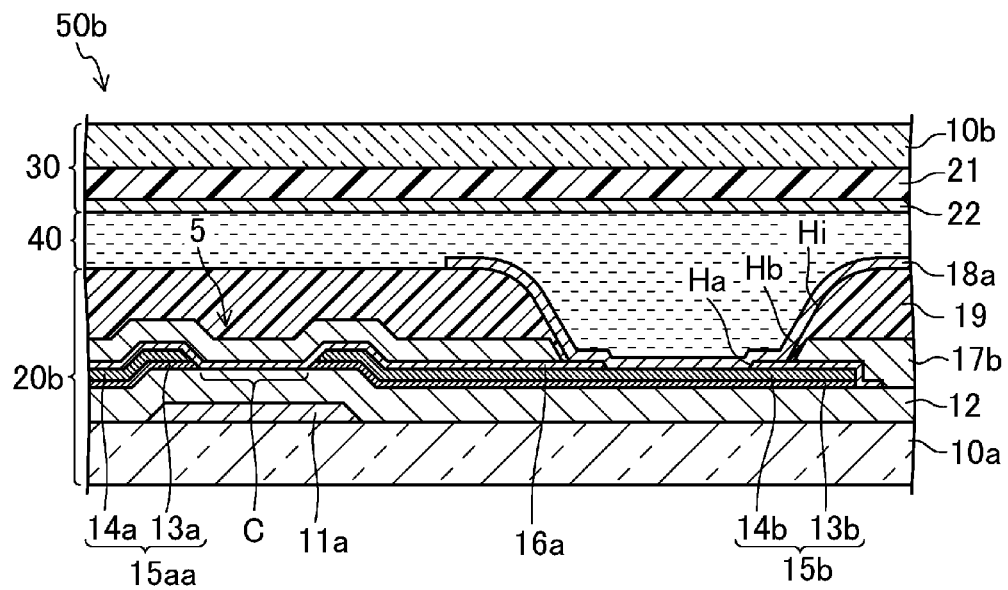
FIG. 11 is a cross-sectional view of a liquid crystal display panel including an active matrix substrate according to a second embodiment.
Figure 12:
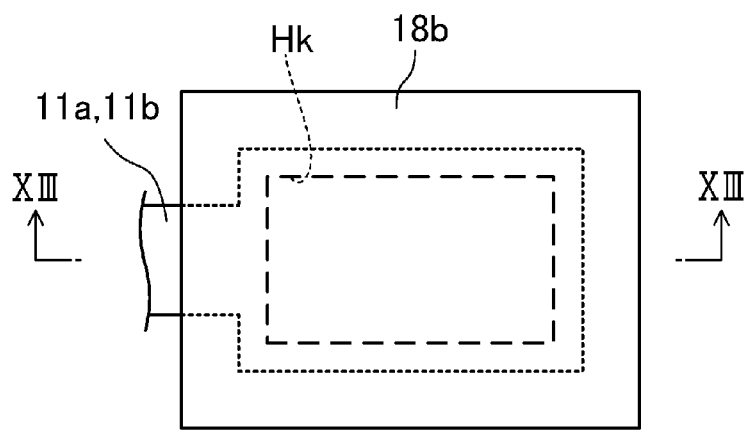
FIG. 12 is a plan view of an interconnect terminal portion of the active matrix substrate of the second embodiment.
Figure 13:
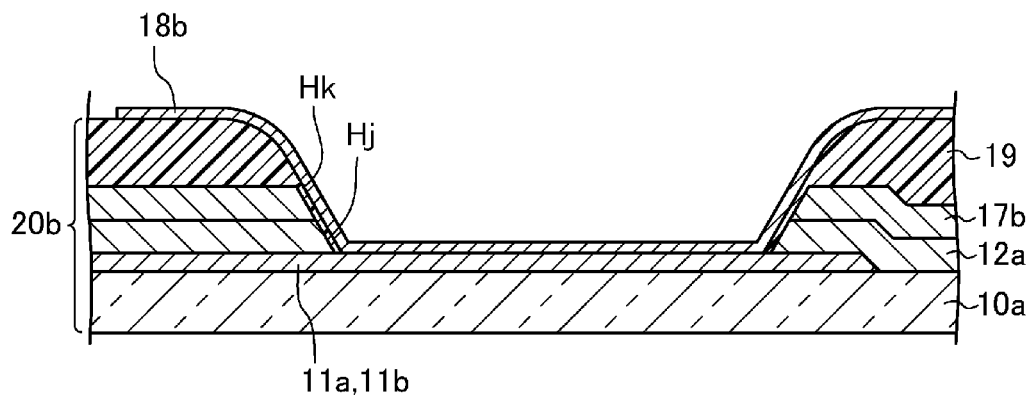
FIG. 13 is a cross-sectional view of the interconnect terminal portion of the active matrix substrate, taken along line XIII-XIII of FIG. 12.
Figure 14:
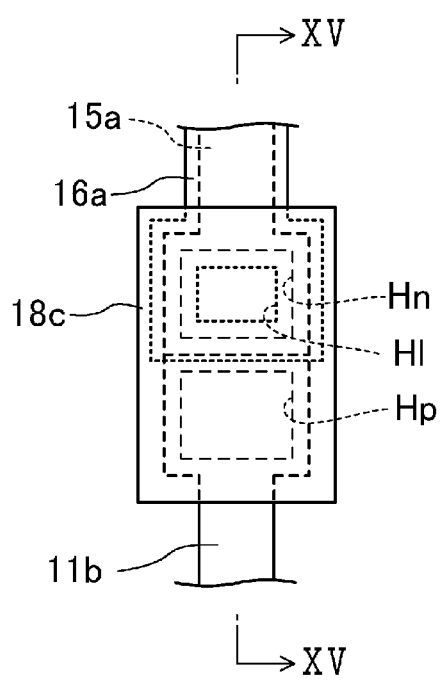
FIG. 14 is a plan view of an interconnect connection portion of the active matrix substrate of the second embodiment.
Figure 15:
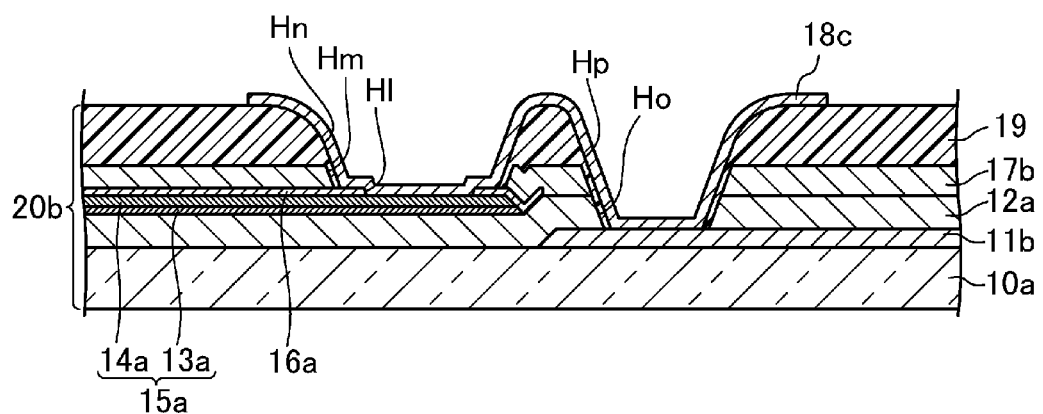
FIG. 15 is a cross-sectional view of the interconnect connection portion of the active matrix substrate, taken along line XV-XV of FIG. 14.

FIGS. 11-18 show a second embodiment of an active matrix substrate and a display panel according to the present invention. Specifically, FIG. 11 is a cross-sectional view of a liquid crystal display panel 50b including an active matrix substrate 20b of this embodiment. FIG. 12 is a plan view of an interconnect terminal portion of the active matrix substrate 20b. FIG. 13 is a cross-sectional view of the interconnect terminal portion, taken along line XIII-XIII of FIG. 12. FIG. 14 is a plan view of an interconnect connection portion of the active matrix substrate 20b. FIG. 15 is a cross-sectional view of the interconnect connection portion, taken along line XV-XV of FIG. 14. Note that, in the embodiments described below, the same parts as those of FIGS. 1-10 are indicated by the same reference characters and will not be described in detail.

In the first embodiment, the liquid crystal display panel has been illustrated which includes the active matrix substrate 20a on which the interlayer insulating film 17a which is a monolayer is provided. In this embodiment, the liquid crystal display panel 50b includes the active matrix substrate 20b on which a multilayer structure including interlayer insulating films 17b and 19 is provided.

As shown in FIG. 11, the liquid crystal display panel 50b includes the active matrix substrate 20b and a counter substrate 30 which face each other, a liquid crystal layer 40 which is provided as a display medium layer between the active matrix substrate 20b and the counter substrate 30, and a frame-like sealing material (not shown) with which the active matrix substrate 20b and the counter substrate 30 are bonded together and which encloses the liquid crystal layer 40 between the active matrix substrate 20b and the counter substrate 30.

As shown in FIG. 11, the active matrix substrate 20b includes a first interlayer insulating film 17b and a second interlayer insulating film 19 which are successively formed to cover TFTs 5, and a plurality of pixel electrodes 18a which are provided on the second interlayer insulating film 19 and arranged in a matrix.

As shown in FIG. 11, the drain electrode 15b is connected to the pixel electrode 18a via a contact hole Ha formed in the semiconductor layer 16a, (a contact hole Hb formed in the interlayer insulating film 17a), and a contact hole Hi formed in the second interlayer insulating film 19. Here, as shown in FIG. 11, the contact hole Hi of the second interlayer insulating film 19 has an inner wall whose upper layer portion has a gentle slope.

The gate line 11a is extended out of a display area for displaying images. As shown in FIGS. 12 and 13, an end portion of the gate line 11a is connected to a corresponding one of interconnect terminal layers 18b arranged in a direction in which the source line 15a is extended, via (a contact hole Hj formed in the multilayer film including the gate insulating film 12a and the first interlayer insulating film 17a and) a contact hole Hk formed in the second interlayer insulating film 19. Here, as shown in FIG. 13, the contact hole Hk of the second interlayer insulating film 19 has an inner wall whose upper layer portion has a gentle slope.

The source line 15a is extended out of the display area. As shown in FIGS. 14 and 15, an end portion of the source line 15a is connected via an interconnect connection layer 18c to a source lead 11b which is provided as another underlying interconnect. The source lead 11b is connected to a corresponding one of the interconnect terminal layers 18b which are arranged along a direction in which the gate line 11a is extended, as with the gate line 11a (see FIGS. 12 and 13). Here, as shown in FIGS. 14 and 15, the source line 15a is connected to the interconnect connection layer 18c via a contact hole Hl formed in the semiconductor layer 16a, (a contact hole Hm formed in the first interlayer insulating film 17b), and a contact hole Hn formed in the second interlayer insulating film 19. As shown in FIG. 15, the contact hole Hk of the second interlayer insulating film 19 has an inner wall whose upper layer portion has a gentle slope. As shown in FIGS. 14 and 15, the source lead 11b is connected to the interconnect connection layer 18c via (a contact hole Ho formed in the multilayer film including the gate insulating film 12a and the first interlayer insulating film 17b and) a contact hole Hp formed in the second interlayer insulating film 19. A shown in FIG. 15, the contact hole Hp of the second interlayer insulating film 19 has an inner wall whose upper layer portion has a gentle slope.

In the liquid crystal display panel 50b thus configured, a predetermined voltage is applied to the liquid crystal layer 40 provided between the pixel electrodes 18a on the active matrix substrate 20b and the common electrode 22 on the counter substrate 30 on a pixel-by-pixel basis to change the alignment of the liquid crystal layer 40 to adjust light transmission through the panel on a pixel-by-pixel basis, whereby an image is displayed.

Figure 16:
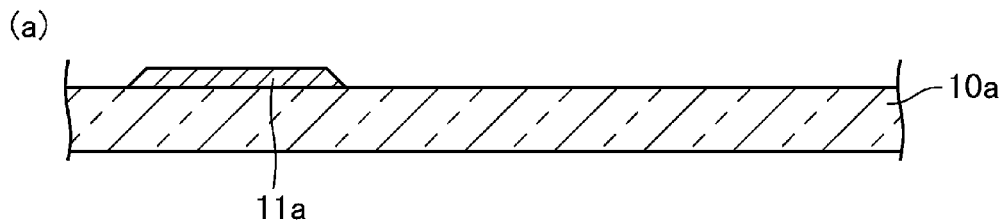
FIG. 16 is a diagram for describing a method for manufacturing the active matrix substrate of the second embodiment, showing cross-sectional views of a pixel portion.
Figure 16:
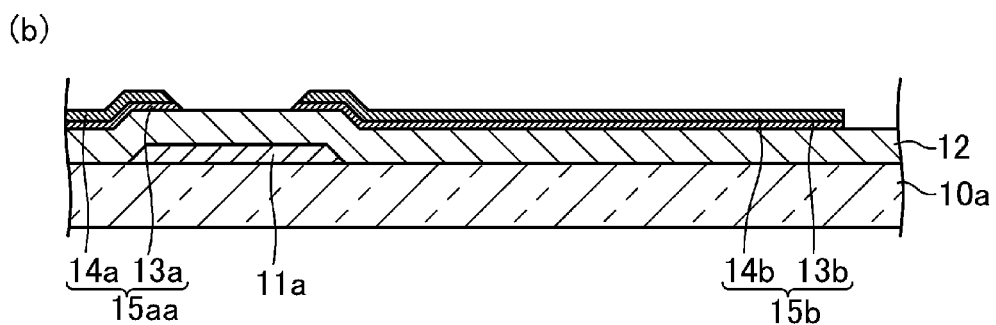
Figure 16:
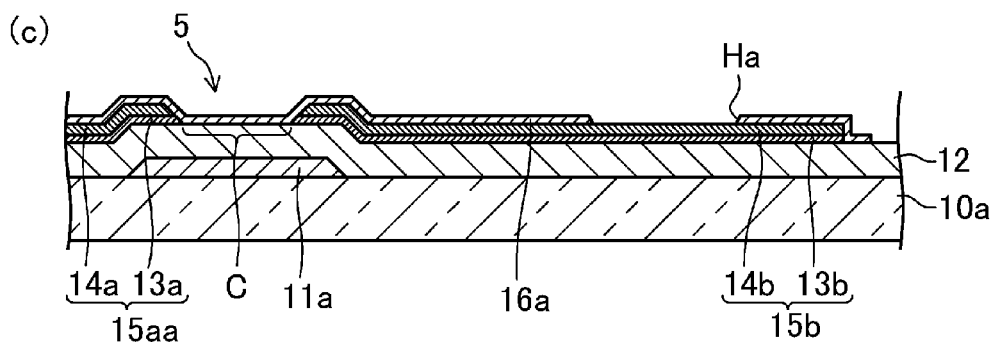
Figure 16:
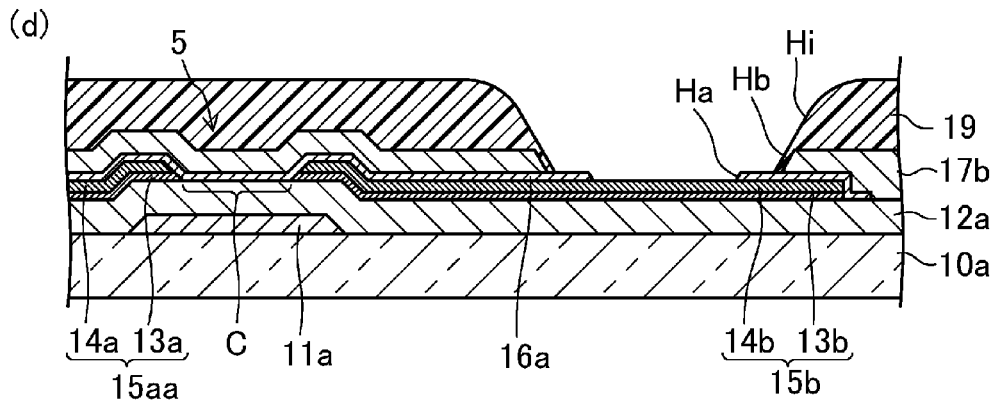
Figure 17:
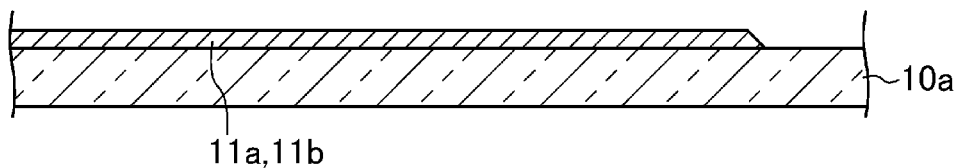
FIG. 17 is a diagram for describing the method for manufacturing the active matrix substrate of the second embodiment, showing cross-sectional views of an interconnect terminal portion.
Figure 17:
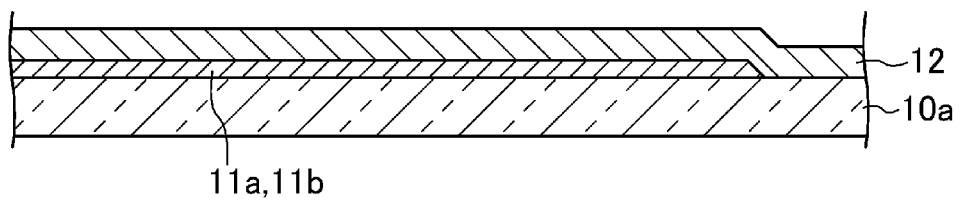
Figure 17:
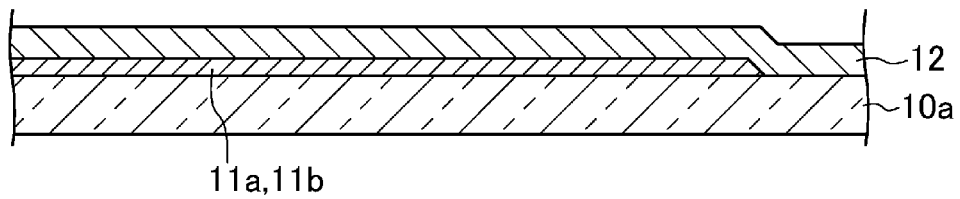
Figure 17:
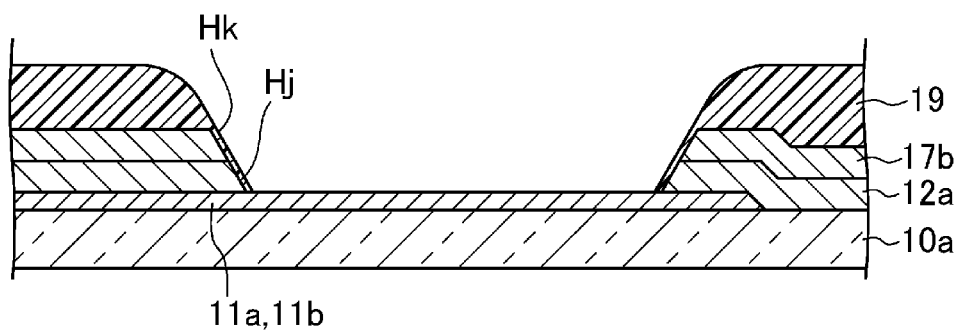
Figure 18:
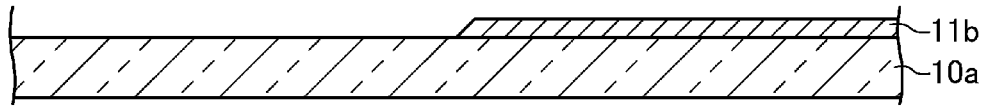
FIG. 18 is a diagram for describing the method for manufacturing the active matrix substrate of the second embodiment, showing cross-sectional views of an interconnect connection portion.
Figure 18:
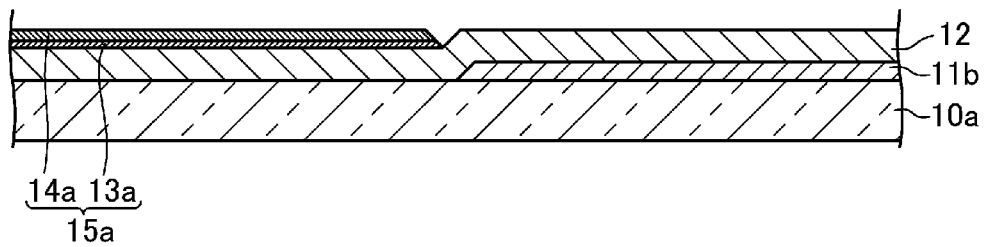
Figure 18:
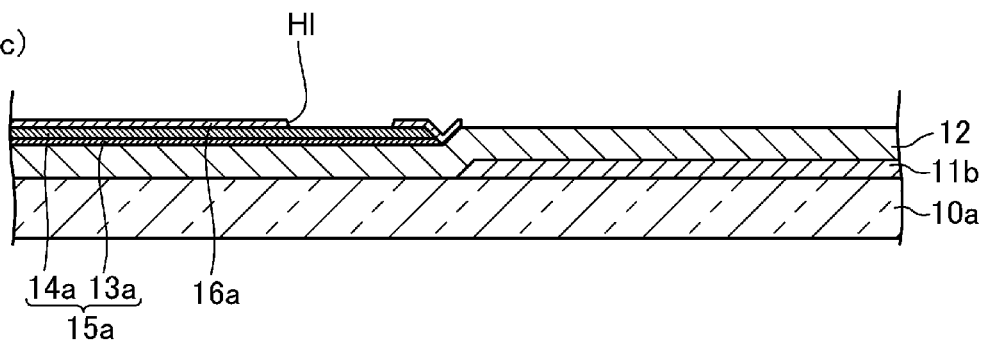
Figure 18:
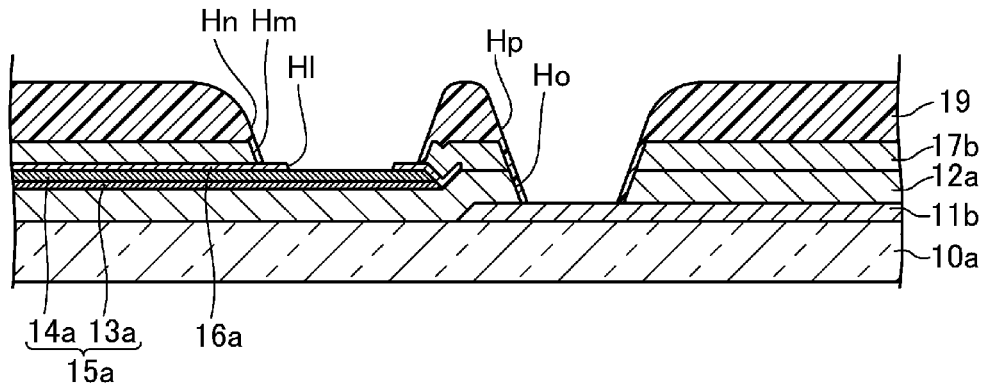

Next, a method for manufacturing the liquid crystal display panel 50b of this embodiment will be described with reference to FIGS. 16-18. Here, FIGS. 16, 17, and 18 are diagrams for describing the method for manufacturing the active matrix substrate 20b, showing cross-sections of a pixel portion, an interconnect terminal portion, and an interconnect connection portion, respectively. Note that the manufacturing method of this embodiment includes an active matrix substrate fabrication process, a counter substrate fabrication process, and a liquid crystal injection process. The counter substrate fabrication process and the liquid crystal injection process are substantially the same as those of the first embodiment. Therefore, the active matrix substrate fabrication process will be described hereinafter.

Initially, for example, a titanium film, an aluminum film, and a titanium film, etc. are successively formed on the entire insulating substrate 10a (e.g., a glass substrate etc.) by sputtering to form a multilayer metal film (e.g., a Ti/Al/Ti film (thickness: about 100-500 nm) etc.). Thereafter, photolithography, wet or dry etching, and resist removal and cleaning are performed on the multilayer metal film. As a result, as shown in FIGS. 16(a), 17(a), and 18(a), the gate line 11a and the source lead 11b are formed.

Next, on the entire substrate on which the gate line 11a and the source lead 11b have been formed, for example, an inorganic insulating film 12 (e.g., a silicon oxide film (thickness: about 200-500 nm) etc.) (see FIGS. 16(b), 17(b), and 18(b)) is formed by CVD, and a barrier film (e.g., a titanium film (thickness: about 10-100 nm) etc.) and a copper film (thickness: about 100-300 nm) are successively formed by sputtering. Thereafter, photolithography, wet or dry etching, and resist removal and cleaning are performed on the multilayer film including the barrier film and the copper film. As a result, as shown in FIGS. 16(b) and 18(b), the source line 15a, the source electrode 15aa, and the drain electrode 15b are formed.

Thereafter, on the entire substrate on which the source line 15a, the source electrode 15aa, and the drain electrode 15b have been formed, for example, an oxide semiconductor film (thickness: about 20-200 nm) of In—Ga—Zn—O (e.g., InGaZnO$_4$ etc.) is formed by sputtering. Thereafter, photolithography, wet etching, and resist removal and cleaning are performed on the oxide semiconductor film. As a result, as shown in FIGS. 16(c), 17(c), and 18(c), the semiconductor layer 16a having the contact holes Ha and Hl is formed.

Next, on the entire surface on which the semiconductor layer 16a has been formed, for example, an inorganic insulating film (e.g., a silicon oxide film (thickness: about 100-300 nm) etc.) is formed by CVD. Thereafter, photolithography, wet or dry etching, and resist removal and cleaning are performed on the inorganic insulating film and the previously formed inorganic insulating film 12. As a result, the gate insulating film 12a and the first interlayer insulating film 17b having the contact holes Hb, Hj, Hm, and Ho are formed (see FIGS. 16(d), 17(d), and 18(d)).

Moreover, on the entire substrate on which the gate insulating film 12a and the first interlayer insulating film 17b have been formed, for example, a photosensitive resin is applied by spin coating or slit coating, and thereafter, the applied film is exposed to light, developed, and baked. As a result, as shown in FIGS. 16(d), 17(d), and 18(d), the second interlayer insulating film 19 (thickness: about 2.0 nm) having the contact holes Hi, Hk, Hn, and Hp is formed. Here, the contact holes Hi, Hk, Hn, and Hp of the second interlayer insulating film 19 each have an inner wall whose upper layer portion has a gentle slope. Such an inner wall is formed by the baking step.

Finally, on the entire substrate on which the second interlayer insulating film 19 has been formed, for example, a transparent conductive film (e.g., an ITO film (thickness: about 50-200 nm) etc.) is formed by sputtering. Thereafter, photolithography, wet etching, and resist removal and cleaning are performed on the transparent conductive film. As a result, as shown in FIGS. 11, 13, and 15, the pixel electrode 18a, the interconnect terminal layer 18b, and the interconnect connection layer 18c are formed.

Thus, the active matrix substrate 20b can be fabricated.

As described above, according to the active matrix substrate 20b of this embodiment and the liquid crystal display panel 50b including the active matrix substrate 20b, as in the first embodiment, the source electrode 15aa and the drain electrode 15b formed of copper are covered by the semiconductor layer 16a of an oxide semiconductor, whereby the diffusion of the copper can be reduced or prevented while an increase in the number of manufacturing steps is reduced or prevented.

In the above embodiments, the liquid crystal display panel has been illustrated as a display panel. The present invention is also applicable to other display panels, such as an organic electroluminescence (EL) panel, an inorganic EL display panel, an electrophoretic display panel, etc.

In the above embodiments, copper has been illustrated as a material for the interconnect layer included in the source line, the source electrode, and the drain electrode. Alternatively, the interconnect layer may be formed of a copper alloy, such as Cu—Mn, Cu—Ca, Cu—Mg, etc.

In the above embodiments, the source line, the source electrode, and the drain electrode which have a two-layer structure (Cu/Ti) have been illustrated. The source line, the source electrode, and the drain electrode may have a three or more layer structure.

In the above embodiments, Ti has been illustrated as a material for the barrier layer between the source line and the source and drain electrodes. The barrier layer may be formed of other metals.

In the above embodiments, the gate insulating film and the (first) interlayer insulating film which are formed of a silicon oxide film have been illustrated. Alternatively, the gate insulating film and the (first) interlayer insulating film may be, for example, a multilayer film including a silicon oxide film and a silicon nitride film (the silicon oxide film is closer to the semiconductor layer).

In the above embodiments, the ITO film has been illustrated as the transparent conductive film included in the pixel electrode and the common electrode. Alternatively, for example, the transparent conductive film may be an indium zinc oxide (IZO) film or the like.

In the above embodiments, the liquid crystal display panel in which the color filter is provided on the counter substrate has been illustrated. The present invention is also applicable to a liquid crystal display panel having a color filter on array structure in which a color filter is provided on the active matrix substrate.

In the above embodiments, the liquid crystal display panel which is manufactured by one drop fill (ODF) has been illustrated. The present invention is also applicable to a liquid crystal display panel which is manufactured by forming an empty cell under atmospheric pressure and thereafter injecting a liquid crystal material into a space between the two substrates of the empty cell by vacuum injection.

In the above embodiments, the oxide semiconductor layer of In—Ga—Zn—O has been illustrated. The present invention is also applicable to the oxide semiconductor layer of In—Si—Zn—O, In—Al—Zn—O, Sn—Si—Zn—O, Sn—Al—Zn—O, Sn—Ga—Zn—O, Ga—Si—Zn—O, Ga—Al—Zn—O, In—Cu—Zn—O, Sn—Cu—Zn—O, Zn—O, In—O, or the like.

In the above embodiments, the active matrix substrate has been illustrated in which an electrode of the TFT which is connected to the pixel electrode serves as a drain electrode. The present invention is also applicable to an active matrix substrate in which the electrode of the TFT connected to the pixel electrode is called a source electrode.

In the above embodiments, the active matrix substrate has been illustrated in which a capacitor line of an auxiliary capacitor is not provided for the pixels. The present invention is also applicable to an active matrix substrate in which a capacitor line of an auxiliary capacitor is provided for each pixel.

INDUSTRIAL APPLICABILITY

As described above, according to the present invention, the copper diffusion can be reduced or prevented while an increase in the number of manufacturing steps is reduced or prevented. Therefore, the present invention is useful for a display panel including an active matrix substrate employing a copper interconnect.

Description of Reference Characters
C CHANNEL REGION
Ha-Hh CONTACT HOLE
S STEP-LIKE PORTION
5 TFT
10a INSULATING SUBSTRATE
11a GATE LINE (GATE ELECTRODE)
11b SOURCE LEAD (UNDERLYING INTERCONNECT)
12a GATE INSULATING FILM
13a, 13b BARRIER LAYER
15a SOURCE LINE
15aa SOURCE ELECTRODE
15b DRAIN ELECTRODE
16a, 16b SEMICONDUCTOR LAYER
17a INTERLAYER INSULATING FILM
18a PIXEL ELECTRODE
18b INTERCONNECT TERMINAL LAYER
18c INTERCONNECT CONNECTION LAYER
20a, 20b ACTIVE MATRIX SUBSTRATE
30 COUNTER SUBSTRATE
40 LIQUID CRYSTAL LAYER (DISPLAY MEDIUM LAYER)
50a, 50b LIQUID CRYSTAL DISPLAY PANEL

The invention claimed is:

1. An active matrix substrate comprising:
a plurality of pixel electrodes arranged in a matrix; and
a plurality of thin film transistors each connected to a corresponding one of the pixel electrodes, and each including a gate electrode provided on an insulating substrate, a gate insulating film covering the gate electrode, a semiconductor layer provided on the gate insulating film and having a channel region overlapping the gate electrode, and a source electrode and a drain electrode of copper or copper alloy provided on the gate insulating film and separated from each other by the channel region of the semiconductor layer,
wherein
the semiconductor layer is formed of an oxide semiconductor and covers the source and drain electrodes,
an interlayer insulating film of a silicon oxide film is provided to cover each of the thin film transistors,
each of the pixel electrodes is provided on the interlayer insulating film, and is connected to the drain electrode of a corresponding one of the thin film transistors via a contact hole formed in the interlayer insulating film and a contact hole formed in the semiconductor layer, and
the contact hole formed in the interlayer insulating film is larger than the contact hole formed in the semiconductor layer as viewed from above, and a step-like portion is provided between an inner wall of the contact hole formed in the interlayer insulating film and an inner wall of the contact hole formed in the semiconductor layer.

2. An active matrix substrate comprising:
a plurality of pixel electrodes arranged in a matrix;
a plurality of thin film transistors each connected to a corresponding one of the pixel electrodes, and each including a gate electrode provided on an insulating substrate, a gate insulating film covering the gate electrode, a semiconductor layer provided on the gate insulating film and having a channel region overlapping the gate electrode, and a source electrode and a drain electrode of copper or copper alloy provided on the gate insulating film and separated from each other by the channel region of the semiconductor layer;
an underlying interconnect formed in the same layer in which the gate electrode is provided and formed of the same material as that of the gate electrode; and
an interconnect terminal layer formed in the same layer in which the pixel electrodes are provided, formed of the same material as that of the pixel electrodes, and connected to the underlying interconnect,
wherein
the semiconductor layer is formed of an oxide semiconductor and covers the source and drain electrodes,
an interlayer insulating film of a silicon oxide film is provided to cover each of the thin film transistors,
the underlying interconnect and the interconnect terminal layer are connected together via a contact hole formed in the interlayer insulating film and a contact hole formed in the gate insulating film, and
another semiconductor layer of the same material as that of the semiconductor layer and having an annular shape is provided between the gate insulating film and the interlayer insulating film, surrounding the contact hole formed in the gate insulating film and being exposed through the contact hole formed in the interlayer insulating film.

3. The active matrix substrate of claim 1, comprising:
an underlying interconnect formed in the same layer in which the gate electrode is provided and formed of the same material as that of the gate electrode; and
an interconnect terminal layer formed in the same layer in which the pixel electrodes are provided, formed of the same material as that of the pixel electrodes, and connected to the underlying interconnect,
wherein
the underlying interconnect and the interconnect terminal layer are connected together via a contact hole formed in the interlayer insulating film and a contact hole formed in the gate insulating film, and
another semiconductor layer of the same material as that of the semiconductor layer and having an annular shape is provided between the gate insulating film and the interlayer insulating film, surrounding the contact hole formed in the gate insulating film and being exposed through the contact hole formed in the interlayer insulating film.

4. The active matrix substrate of claim 2, wherein
the underlying interconnect is a gate line connected to the gate electrode.

5. The active matrix substrate of claim 2, comprising:
a source line formed in the same layer in which the source and drain electrodes are provided, formed of the same material as that of the source and drain electrodes, covered by the semiconductor layer, and connected to the source electrode; and
an interconnect connection layer formed of the same layer in which the pixel electrodes are formed, formed of the same material as that of the pixel electrodes, and connecting the underlying interconnect and the source line together, wherein the source line and the interconnect connection layer are connected together via a contact hole formed in the interlayer insulating film and a contact hole formed in the semiconductor layer, in a connection portion of the source line and the interconnect connection layer, the contact hole formed in the interlayer insulating film is larger than the contact hole formed in the semiconductor layer as viewed from above, and a step-like portion is provided between an inner wall of the contact hole formed in the interlayer insulating film and an inner wall of the contact hole formed in the semiconductor layer, the underlying interconnect and the interconnect connection layer are connected together via the contact hole formed in the interlayer insulating film and the contact hole formed in the gate insulating film, and in a connection portion of the underlying interconnect and the interconnect connection layer, the semiconductor layer is provided between the gate insulating film and the interlayer insulating film, surrounding the contact hole formed in the gate insulating film and being exposed through the contact hole formed in the interlayer insulating film.

6. A display panel comprising:
an active matrix substrate and a counter substrate facing each other; and
a display medium layer provided between the active matrix substrate and the counter substrate, wherein the active matrix substrate includes
a plurality of pixel electrodes arranged in a matrix, and
a plurality of thin film transistors each connected to a corresponding one of the pixel electrodes, and each including a gate electrode provided on an insulating substrate, a gate insulating film covering the gate electrode, a semiconductor layer provided on the gate insulating film and having a channel region overlapping the gate electrode, and a source electrode and a drain electrode of copper or copper alloy provided on the gate insulating film and separated from each other by the channel region of the semiconductor layer, and the semiconductor layer is formed of an oxide semiconductor and covers the source and drain electrodes, an interlayer insulating film of a silicon oxide film is provided to cover each of the thin film transistors, each of the pixel electrodes is provided on the interlayer insulating film, and is connected to the drain electrode of a corresponding one of the thin film transistors via a contact hole formed in the interlayer insulating film and a contact hole formed in the semiconductor layer, and the contact hole formed in the interlayer insulating film is larger than the contact hole formed in the semiconductor layer as viewed from above, and a step-like portion is provided between an inner wall of the contact hole formed in the interlayer insulating film and an inner wall of the contact hole formed in the semiconductor layer.

7. A display panel comprising:
an active matrix substrate and a counter substrate facing each other; and
a display medium layer provided between the active matrix substrate and the counter substrate, wherein the active matrix substrate includes
a plurality of pixel electrodes arranged in a matrix, and
a plurality of thin film transistors each connected to a corresponding one of the pixel electrodes, and each including a gate electrode provided on an insulating substrate, a gate insulating film covering the gate electrode, a semiconductor layer provided on the gate insulating film and having a channel region overlapping the gate electrode, and a source electrode and a drain electrode of copper or copper alloy provided on the gate insulating film and separated from each other by the channel region of the semiconductor layer;

an underlying interconnect formed in the same layer in which the gate electrode is provided and formed of the same material as that of the gate electrode; and an interconnect terminal layer formed in the same layer in which the pixel electrodes are provided, formed of the same material as that of the pixel electrodes, and connected to the underlying interconnect, the semiconductor layer is formed of an oxide semiconductor and covers the source and drain electrodes, an interlayer insulating film of a silicon oxide film is provided to cover each of the thin film transistors, the underlying interconnect and the interconnect terminal layer are connected together via a contact hole formed in the interlayer insulating film and a contact hole formed in the gate insulating film, and another semiconductor layer of the same material as that of the semiconductor layer and having an annular shape is provided between the gate insulating film and the interlayer insulating film, surrounding the contact hole formed in the gate insulating film and being exposed through the contact hole formed in the interlayer insulating film.

8. The active matrix substrate of claim 1, wherein the oxide semiconductor is an In—Ga—Zn—O oxide semiconductor layer.

9. The display panel of claim 6, wherein the oxide semiconductor is an In—Ga—Zn—O oxide semiconductor layer.

* * * * *